United States Patent
Okayasu et al.

(10) Patent No.: US 9,448,485 B2
(45) Date of Patent: Sep. 20, 2016

(54) COMPOSITION FOR FORMING FINE RESIST PATTERN AND PATTERN FORMING METHOD USING SAME

(71) Applicants: Tetsuo Okayasu, Shizuoka (JP); Takashi Sekito, Shizuoka (JP); Masahiro Ishii, Shizuoka (JP)

(72) Inventors: Tetsuo Okayasu, Shizuoka (JP); Takashi Sekito, Shizuoka (JP); Masahiro Ishii, Shizuoka (JP)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 14/344,943

(22) PCT Filed: Oct. 10, 2012

(86) PCT No.: PCT/JP2012/076167
§ 371 (c)(1),
(2) Date: Mar. 14, 2014

(87) PCT Pub. No.: WO2013/054803
PCT Pub. Date: Apr. 18, 2013

(65) Prior Publication Data
US 2015/0017587 A1   Jan. 15, 2015

(30) Foreign Application Priority Data
Oct. 11, 2011   (JP) .................. 2011-224030

(51) Int. Cl.
G03F 7/40 (2006.01)
H01L 21/027 (2006.01)
G03F 7/32 (2006.01)
G03F 7/11 (2006.01)
G03F 7/039 (2006.01)
C08F 220/56 (2006.01)
C08F 226/02 (2006.01)

(52) U.S. Cl.
CPC .............. *G03F 7/40* (2013.01); *G03F 7/0392* (2013.01); *G03F 7/11* (2013.01); *G03F 7/325* (2013.01); *G03F 7/405* (2013.01); *H01L 21/0273* (2013.01); *C08F 220/56* (2013.01); *C08F 226/02* (2013.01)

(58) Field of Classification Search
CPC .......... G03F 7/004; G03F 7/095; G03F 7/11; G03F 7/40
USPC .............................. 430/270.1, 331
See application file for complete search history.

(56) References Cited

U.S. PATENT DOCUMENTS 4,361,639 A * 11/1982 Kanada et al. ............... 430/204
4,612,346 A * 9/1986 Chiba et al. .................. 525/66
5,143,813 A * 9/1992 Joerg ............................ 430/162
5,398,092 A * 3/1995 Tanno et al. .................. 396/604
5,698,647 A * 12/1997 Huckestein et al. ......... 526/219.5
6,649,323 B2 * 11/2003 Pappas et al. ............. 430/271.1
6,899,994 B2 * 5/2005 Huang et al. .............. 430/271.1
7,399,582 B2    7/2008 Takahashi et al.
7,595,141 B2    9/2009 Kudo et al.
7,745,077 B2    6/2010 Thiyagarajan et al.
7,745,093 B2    6/2010 Nishibe et al.
7,923,200 B2    4/2011 Thiyagarajan et al.
8,101,333 B2    1/2012 Noya et al.
2004/0142279 A1    7/2004 Bok et al.
2004/0234834 A1 * 11/2004 Narayanan et al. ............ 429/33
2009/0047588 A1 * 2/2009 Yanus et al. ................. 430/58.5
2009/0317739 A1 * 12/2009 Thiyagarajan et al. ... 430/270.1
2010/0028803 A1 * 2/2010 Sugimoto et al. ......... 430/270.1
2010/0239984 A1    9/2010 Tsubaki

FOREIGN PATENT DOCUMENTS

| JP | 10-73927 A    | 3/1998  |
|----|---------------|---------|
| JP | 2003-84459 A  | 3/2003  |
| JP | 2004-212967 A | 7/2004  |
| JP | 2005-300853 A | 10/2005 |
| JP | 2006-307179 A | 11/2006 |

(Continued)

OTHER PUBLICATIONS

Machine translation of JP 10-073927, published on Mar. 17, 1998.*

*Primary Examiner* — Anca Eoff
(74) *Attorney, Agent, or Firm* — Mitchell Brustein

(57) ABSTRACT

[Object] To provide a composition enabling to form a fine negative photoresist pattern free from troubles, such as, surface roughness, bridge defects, and resolution failure; and also to provide a pattern formation method using that composition.

[Means to Solve the Problem] A fine pattern-forming composition is used for miniaturizing a resist pattern by fattening said pattern in a process of formation of a negative resist pattern using a chemically amplified resist composition. The fine pattern-forming composition comprises a polymer comprising a repeating unit having a structure of the following formula (A), (B) or (C):

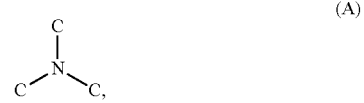

(A)

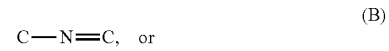

(B)

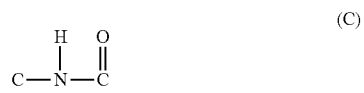

(C)

and a solvent. This composition is cast on a negative resist pattern obtained by development with an organic solvent developer, and then heated to form a fine pattern.

7 Claims, No Drawings

(56) References Cited

FOREIGN PATENT DOCUMENTS

| JP | 2008-102348 A | 5/2008 |
|---|---|---|
| JP | 2008-518260 A | 5/2008 |
| JP | 2010-139996 A | 6/2010 |
| JP | 2010-524040 A | 7/2010 |
| JP | 4558064 B2 | 7/2010 |
| JP | 2011-524930 A | 9/2011 |
| JP | 2013-64829 A | 4/2013 |
| WO | WO 2005/008340 A1 | 1/2005 |

* cited by examiner

US 9,448,485 B2

COMPOSITION FOR FORMING FINE RESIST PATTERN AND PATTERN FORMING METHOD USING SAME

This application is a United States National Stage Patent Application under 35 U.S.C. §371 of International Patent Application No. PCT/JP2012/076167, filed Oct. 10, 2012, which claims priority to Japanese Patent Application No. 2011-224030, filed Oct. 11, 2011, the contents of which are being hereby incorporated herein by reference.

TECHNICAL FIELD

The present invention relates to a composition for obtaining a fine resist pattern miniaturized by fattening or thickening a beforehand formed resist pattern in a production process of semiconductor devices and the like, and this invention also relates to a pattern formation method employing that composition.

BACKGROUND ART

In manufacturing semiconductor devices, resist patterns have been required to be made minute enough to meet increased integration density and highly accelerated processing speed in LSIs. Resist patterns are normally formed in photo-lithographic processes from, for example, positive-working type resists, whose solubilities to alkaline developers are increased by exposure to light. Accordingly, the resists in the areas exposed to light are removed away with the alkaline developers to form positive resist patterns. However, the fineness of the resultant patterns greatly depends on the exposure methods and light sources, and hence in order to stably produce fine resist patterns, a huge investment is necessary to install special and expensive facilities and equipments needed for the exposure methods and light sources capable of ensuring the fineness.

In view of that, there are various techniques studied for further miniaturizing resist patterns formed beforehand by conventional methods. For example, they include a practical method in which a resist pattern stably produced by a conventional method is coated with a composition comprising a water-soluble resin and optional additives so as to fatten or thicken the resist pattern and thereby to decrease the diameter of holes and/or the width of furrow lines separating the ridges in the pattern.

Specifically, the following processes and composition are known:
(1) a process comprising the steps of
  coating a conventionally formed resist pattern with a composition crosslinkable by an acid,
  heating the resist pattern to diffuse the acid comprised in the resist so that the composition on the resist may be crosslinked to form a crosslinked layer at the interface therebetween as a covering layer of the resist pattern, and
  removing the uncrosslinked composition with a developer to fatten or thicken the resist pattern and thereby to decrease the diameter of holes and/or the width of furrow lines separating the ridges in the pattern (see, Patent documents 1 and 2);
(2) a process comprising the steps of
  coating a conventionally formed resist pattern with an aqueous solution of a copolymer derived from (meth)acrylic acid monomers and water-soluble vinyl monomers, and
  heating the resist pattern to shrink and thereby to become finer (see, Patent document 3); and (3) a water-soluble coating composition which comprises a polymer comprising amino groups, in particular, primary amines and which is used for covering a photoresist pattern (see, Patent document 4).

However, when the pattern to be miniaturized is intended to be formed before the above miniaturization process, it is difficult to stably obtain a pattern near the resolution limit. In order to improve this problem, studies have been made on methods for stably forming patterns near the resolution limit by use of organic solvent developers. For example, there is a known method in which line width variance (LWR), exposure latitude (EL) and depth of focus (DOF) are improved enough to form stably a pattern by combination of a positive-working type resist composition and an organic solvent developer (see, Patent document 5). In this method, the resist in the exposed area becomes highly soluble in an alkaline developer but hardly soluble in an organic solvent. By making use of that, the method makes it possible to form a negative pattern from a positive-working type resist.

Further, after thus formed from a positive-working type resist, the negative pattern can be further improved in resolution by a technique in which a composition comprising a crosslinking agent is cast on the pattern and then heated and rinsed away (see, Patent document 6).

PRIOR ART DOCUMENTS

Patent Documents

[Patent document 1] Japanese Patent Laid-Open No. 10(1998)-73927
[Patent document 2] Japanese Patent Laid-Open No. 2005-300853
[Patent document 3] Japanese Patent Laid-Open No. 2003-84459
[Patent document 4] Japanese Patent Laid-Open No. 2008-518260
[Patent document 5] Japanese Patent Laid-Open No. 2010-139996
[Patent document 6] Japanese Patent No. 4558064

DISCLOSURE OF INVENTION

Problem to be Solved by the Invention

However, even if the negative pattern formed from combination of a positive-working type resist and an organic solvent developer is intended to be miniaturized according the known method, it is often difficult to obtain satisfying results. Specifically, the pattern often suffers from troubles, such as, surface roughness, bridge defects, and resolution failure. In a general process of formation of a pattern using a positive-working photoresist, first a photoresist layer is formed by casting a composition comprising a photo acid-generating agent, which generates an acid when irradiated with light, and a resin which is made to react by the acid to become soluble in an alkaline developer; and then the formed photoresist layer is imagewise exposed to light. The photo acid-generating agent in the exposed area releases an acid, and accordingly the photoresist layer in the exposed area is made to become alkali-soluble by the acid. If the exposed photoresist layer is then developed with an alkaline developer, the alkali-solubilized part is removed away with the alkali solution. However, if developed with an organic solvent developer, the photoresist layer is removed in the unexposed area, where the acid is not released, to leave a pattern comprising the acid in a large amount. When the thus formed pattern is coated with a conventional fine resist pattern-forming composition, crosslinking reactions may occur vigorously and/or the composition may penetrate into the pattern too much and, as a result, the troubles such as, surface roughness, bridge defects and resolution failure tend to be caused. The present applicant has made a detailed study and found that those troubles are caused similarly even if the miniaturization process is carried out by use of a crosslinked layer-forming composition that is said to be suitable for the negative resist pattern formed from combination of a positive-working type resist composition and an organic solvent developer. Further, since often comprising basic substances such as primary amines, conventional fine pattern-forming compositions are generally so basic that they are liable to solve the pattern comprising a large amount of the acid. Because of those reasons, the pattern is presumed to suffer from the troubles, such as, surface roughness, bridge defects and resolution failure.

In view of the above problem, it is an object of the present invention to provide a composition which enables to stably form a fine pattern by coating to fatten or thicken a negative resist pattern beforehand formed by developing a chemically amplified positive-working type photoresist with an organic solvent developer. Further, it is another object of the present invention to provide a pattern formation method employing that composition.

Means for Solving Problem

The present invention resides in a fine pattern-forming composition used for miniaturizing a resist pattern by fattening said pattern in a process of formation of a negative resist pattern using a chemically amplified resist composition,
comprising
a polymer comprising a repeating unit having a structure of the following formula (A), (B) or (C):

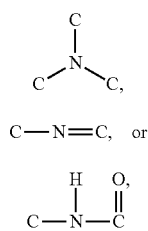

and
a solvent.

The present invention also resides in a method for forming a miniaturized negative resist pattern, comprising the steps of
coating a semiconductor substrate with a chemically amplified photoresist composition, to form a photoresist layer;
exposing to light said semiconductor substrate coated with said photoresist layer;
developing said photoresist layer with an organic solvent developer after said exposing step, to form a photoresist pattern;
coating said photoresist pattern with a fine pattern-forming composition comprising: a polymer comprising a repeating unit having a structure of the following formula (A), (B) or (C):

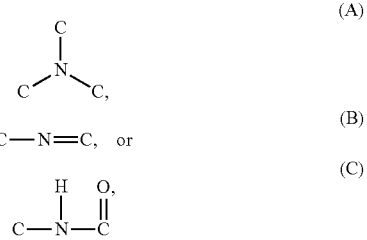

and a solvent;
heating the coated photoresist pattern, and
washing to remove excess of the fine pattern-forming composition.

Effect of the Invention

The present invention enables to obtain a fine negative photoresist pattern free from troubles, such as, surface roughness, bridge defects, and resolution failure.

BEST MODE FOR CARRYING OUT THE INVENTION

Embodiments according to the present invention are described below in detail.
Fine Pattern-Forming Composition
The fine pattern-forming composition of the present invention comprises a solvent and a polymer comprising a particular structure. The polymer adopted in the present invention comprises a repeating unit having a structure of the following formula (A), (B) or (C)

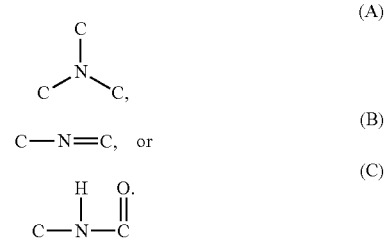

The fine pattern-forming composition according to the present invention comprises the above polymer. This means that the composition of the present invention comprises a polymer including an amine having no nitrogen-hydrogen bond, which is highly reactive in the present process, or a polymer including an amido group of very poor reactivity. Accordingly, when the composition is brought into contact with a pattern formed by development with an organic solvent developer, the polymer is intermixed with the resist pattern and/or the composition comprising the polymer is attached onto the pattern surface. As a result, the resist pattern is fattened and thereby miniaturized. Since comprising the particular structure, the polymer has such proper basicity as to inhibit excessive reactions with hydroxyl groups and the like comprised in resins and the like of the resist pattern. The troubles such as surface roughness are presumed to be thus improved.

As for the particular structure comprised in the polymer adopted in the present invention, the structure represented by the formula (A) comprises a nitrogen atom connecting to three carbon atoms via single bonds. This structure is generally seen in tertiary amines. In the structure (A), the carbon atoms linking to the nitrogen atom may connect to each other via hydrocarbon chains to form a cyclic structure. The cyclic structure may include an unsaturated bond between the member atoms, and further at least one of the carbon atoms constituting the cyclic structure may be replaced with an oxygen atom or another nitrogen atom to form a heterocyclic ring. For example, this structure can be found in polymers derived from N,N-dimethylvinylamine, N,N-dimethylallylamine, N-vinylpyrrolidone, N-vinylcaprolactam and the like.

The structure represented by the formula (B) comprises a nitrogen atom connecting to two carbon atoms one of which links via a single bond and the other of which links via a double bond. This structure may be positioned between chain hydrocarbon structures, or may be included in a heterocyclic ring. The heterocyclic ring may include another unsaturated bond in addition to the unsaturated bond comprised in the structure (B). Examples of the heterocyclic ring include imidazole ring, oxazole ring, pyridine ring, and bipyridine ring. Among them, imidazole ring and oxazole ring are preferred. Further, if the structure (B) is included in an imidazole ring, the resultant composition has excellent coatability and gives large pattern shrinkage effect. Accordingly, imidazole ring is particularly preferred.

The structure represented by the formula (C) comprises a nitrogen atom connecting to a hydrogen atom via a single bond, to a carbon atom via a single bond, and to a carbonyl group. This structure is included in an amide bond. The polymer comprising the structure (C) is preferably represented by the following formula (C-1):

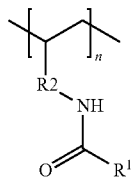

(C-1)

in which $R^1$ is a hydrogen atom or a hydrocarbon group of 1 to 10 carbon atoms; $R^2$ is a single bond or a hydrocarbon group of 1 to 10 carbon atom; and $R^1$ and $R^2$ may connect to each other to form a cyclic structure.

Specifically, the amide bond may be positioned at the midst or terminal of a side-chain hydrocarbon group connecting to the main chain of the polymer, or may be included in a side-chain lactam ring or the like.

The particular structure-containing polymer adopted in the present invention comprises a repeating unit having the above structure (A), (B) or (C), which is properly selected according to the kind of the resist pattern on which the composition is intended to be applied and also to availability of the polymer. However, since giving favorable results in coatability and in degree of pattern shrinkage, the polymer comprising a repeating unit having the structure (B) or (C) is preferably employed.

The polymer usable in the fine pattern-forming composition of the present invention comprises polymerization units derived from monomers having the above substituent groups. Examples of the monomers include vinylimidazole, vinyloxazole, vinylcaprolactam, N,N-dialkylallylamine, and N-alkylpyrroline.

Those monomers may be combined with other monomers not having the above particular structures in such amounts that the effect of the present invention is not impaired, to form copolymers. Those copolymers can be employed in the fine pattern-forming composition of the present invention. For example, the copolymers may comprise co-polymerization units of polyacrylic acid, polymethacrylic acid or polyvinyl alcohol.

As long as the effect of the present invention is not impaired, the polymerization units may be derived from monomers including primary or secondary amine structures. However, if comprising those units in too large an amount, the polymer often cannot keep adequate affinity with resins in the photoresist to obtain the effect of the present invention. That has been thought to be because the polymer in itself has high basicity. However, surprisingly the affinity cannot be improved by, for example, controlling the pH value of the composition. In consideration of that, the repeating units including primary or secondary amine structures are comprised in an amount of preferably 40 mol % or less, further preferably 30 mol % or less, based on the total polymerization units of the polymer.

There are no particular restrictions on the molecular weight of the particular structure-containing polymer used in the present invention, but the weight average molecular weight thereof is generally 3000 to 200000, preferably 5000 to 150000. Here, the "weight average molecular weight" means a weight average molecular weight in terms of polystyrene standard measured by gel permeation chromatography.

As the solvent, water is generally adopted. The water preferably purified by distillation, ion-exchange treatment, filtration, various kinds of adsorption treatment or the like so as to remove organic impurities, metal ions and the like. It is particularly preferred to use pure water. For the purpose of improving wettability, a small amount of organic solvent may be incorporated as a co-solvent. Examples of the organic solvent include: alcohols such as methyl alcohol, ethyl alcohol, and propyleneglycol monomethyl ether; ketones such as acetone and methyl ethyl ketone; and esters such as ethyl lactate and ethyl acetate. The solvent should be so selected that it may not dissolve or denature the resist layer on which the composition is intended to be applied.

As described above, the fine pattern-forming composition of the present invention comprises a solvent and a polymer containing the particular structure. The content of the polymer is freely selected according to the size and kind of the resist pattern and also to the aimed pattern fineness. However, the polymer is comprised in an amount of generally 0.1 to 10 wt %, preferably 1.0 to 7.0 wt % based on the total weight of the composition.

The fine pattern-forming composition according to the present invention may further comprise an acid. There are no particular restrictions on the acid usable in the present invention unless it gives unfavorable effects to the resist pattern. The acid can be selected from inorganic or organic acids. Examples of the organic acids include: acetic acid, malonic acid, citric acid, glycine, glutamic acid, p-toluenesulfonic acid, and camphorsulfonic acid. Examples of the inorganic acids include hydrochloric acid, sulfuric acid, and nitric acid. When the fine pattern-forming composition is used to miniaturize a pattern, the resultant photoresist pattern often suffers from surface roughness. This surface roughness may be improved if the composition comprises the acid. On the other hand, however, if comprising the acid too much, the composition may be impaired in coatability and in degree of fattening the pattern. Accordingly, the amount of the acid in the composition is generally 0.5 to 50 wt %, preferably 2.5 to 30 wt %, based on the total weight of the polymer containing the particular structure.

The fine pattern-forming composition generally has a pH value of preferably 2 to 11 inclusive, more preferably 3 to 10 inclusive. If the pH value is less than 2 or more than 11, the composition often dissolves the photoresist pattern to roughen the surface thereof. It is hence preferred to adjust the pH value properly.

Further, the fine pattern-forming composition of the present invention can comprise other additives, if necessary. Examples of the additives include surfactants, germicides, antibacterial agents, antiseptic agents and anti-mold agents. Among them, in view of the coatability, the composition preferably comprises a surfactant. The additives give no essential effects to the performance of the composition, and the amount thereof is normally 1% or less, preferably 0.1% or less, further preferably 0.001% or less, based on the total weight of the composition. However, it is possible to improve the coatability without using the surfactants if the surface of the resist pattern is pretreated before the fine pattern-forming composition is cast thereon (described later in detail).

Pattern Formation Method

The following is an explanation of the method according to the present invention for forming a fine resist pattern. The pattern formation method described below is a typical one using the fine pattern-forming composition of the present invention.

First, a chemically amplified photoresist is cast on a surface, which may be pretreated if necessary, of a substrate, such as a silicon substrate, according to a known coating method such as spin-coating method, to form a chemically amplified photoresist layer. Prior to casting the photoresist, an antireflective coat may be beforehand formed on the substrate surface. The antireflective coat can improve the section shape and the exposure margin.

Any known chemically amplified photoresist can be used in the pattern formation method of the present invention. The chemically amplified photoresist generates an acid when exposed to radiation such as UV light, and the acid serves as a catalyst to promote chemical reaction by which solubility to an alkali developer is increased within the areas irradiated with the radiation to form a pattern. For example, the chemically amplified photoresist comprises an acid-generating compound, which generates an acid when exposed to radiation, and an acid-sensitive functional group-containing resin, which decomposes in the presence of acid to form an alkali-soluble group such as phenolic hydroxyl or carboxyl group. The photoresist may comprise an alkali-soluble resin, a crosslinking agent and an acid-generating compound.

In the present invention, the photoresist pattern is formed by a process in which the area where alkali-soluble groups are not generated is removed with an organic solvent developer. Accordingly, the present invention provides a negative photoresist pattern, which is a pattern remaining in the exposed area, from a chemically amplified photoresist that serves as a positive resist in a normal development with an alkaline developer.

According to necessity, the chemically amplified photoresist layer formed on the substrate is prebaked, for example, on a hot plate to remove solvent comprised in the photoresist, to form a photoresist film normally having a thickness of about 50 to 500 nm. The prebaking temperature depends on the solvent and the photoresist, but is normally about 50 to 200° C., preferably about 70 to 150° C.

The photoresist film is then subjected to exposure through a mask, if necessary, by means of known exposure apparatus such as a high-pressure mercury lamp, a metal halide lamp, an ultra-high pressure mercury lamp, a KrF excimer laser, an ArF excimer laser, a soft X-ray irradiation system, and an electron beam lithography system.

After the exposure, baking treatment may be carried out, if necessary, and then development such as paddle development is carried out to form a resist pattern. In the present invention, the resist is developed with an organic solvent developer. Any organic solvent developer can be adopted as long as it does not dissolve the photoresist film in the area irradiated with radiation and thereby solubilized in an alkaline aqueous solution but dissolves the film in the area not irradiated and hence kept insoluble in an alkaline aqueous solution. The photoresist film in the area insoluble in an alkaline aqueous solution is generally easily dissolved in an organic solvent, and hence the organic solvent developer can be selected from a relatively wide range. Examples of the organic solvents usable as the developer include: polar solvents, such as, ketones, esters, alcohols, amides and ethers; and hydrocarbons.

Examples of the ketone solvents include 1-octanone, 2-octanone, 2-nonanone, 2-nonanone, 4-heptanone, 1-hexanone, 2-hexanone, diisobutyl ketone, cyclohexanone, methyl ethyl ketone, methyl isobutyl ketone, and acetophenone.

Examples of the ester solvents include ethyl acetate, n-propyl acetate, isopropyl acetate, n-butyl acetate, propylene glycol monomethyl ether acetate, ethylene glycol monoethyl ether acetate, diethylene glycol monobutyl ether acetate, diethylene glycol monoethyl ether acetate, 3-methoxybutyl acetate, 3-methyl-3-methoxybutyl acetate, ethyl lactate, butyl lactate, and propyl lactate.

Examples of the alcohol solvents include: alcohols, such as, ethyl alcohol, n-propyl alcohol, isopropyl alcohol, n-butyl alcohol, sec-butyl alcohol, n-hexyl alcohol, and n-heptyl alcohol; glycols, such as, ethylene glycol, propylene glycol, and diethylene glycol; and glycol ethers, such as, ethylene glycol monomethyl ether, propylene glycol monomethyl ether, diethylene glycol monomethyl ether, triethylene glycol monoethyl ether, and methoxymethyl butanol.

Examples of the ether solvents include the above glycol ethers, di-n-propyl ether, di-n-butyl ether, dioxane, and tetrahydrofuran.

Examples of the amide solvents include N-methyl-2-pyrrolidone, N,N-dimethylacetamide, and N,N-dimethylformamide.

Examples of the hydrocarbon solvents include: aromatic hydrocarbons, such as, toluene and xylene; and aliphatic hydrocarnons, such as, pentane, hexane, octane, and decane.

Those solvents may be used in combination of two or more, and can be combined with inorganic solvents such as water unless they impair the effect of the present invention.

After the development, the resist pattern is preferably rinsed (washed) with a rinse solution. In the present invention, the rinse procedure is preferably carried out by use of a rinse solution comprising at least one organic solvent selected from the group consisting of alkane solvents, ketone solvents, ester solvents, alcohol solvents, amide solvents, and ether solvents.

Specifically, examples of the rinse solution used in the rinse procedure after the development include: n-hexyl alcohol, n-heptyl alcohol, and benzyl alcohol. Two or more of those solvents may be mixed to use, and they may be used in combination with other solvents such as water.

The rinse solution comprises water in an amount of preferably 10 wt % or less, further preferably 5 wt % or less, particularly preferably 3 wt % or less. If the water content is controlled to be 10 wt % or less, the rinse solution can have favorable developing properties. The rinse solution may further comprise a proper amount of surfactants.

Subsequently, the obtained resist pattern is miniaturized by applying the fine pattern-forming composition of the present invention. However, prior to applying the composition, the resist pattern may be subjected to surface treatment by applying water or an organic solvent not dissolving the pattern. This surface treatment improves the coatability of the composition, so that the composition can be spread evenly. This means that the coatability can be improved without adding additives for improving the coatability, such as surfactants, into the composition. This treatment is often referred to as "pre-wet treatment".

Thereafter, the fine pattern-forming composition of the present invention is cast so as to cover the whole resist pattern, and consequently the resist pattern is fatten or thicken by the interaction between the resist pattern and the composition. This interaction is presumed to be such impregnation of the polymer into the resist and/or such adhesion of the polymer onto the resist as fattens or thickens the resist pattern.

Specifically, the fine pattern-forming composition of the present invention soaks into and/or attaches onto the inner walls of grooves or holes in the resist pattern, to fatten or thicken the pattern. As a result, the composition narrows the width of furrow lines separating the ridges in the pattern, and thereby enables to essentially miniaturize the pitch size and hole opening size of the resist pattern more than the resolution limit.

In the pattern formation method of the present invention, the fine pattern-forming composition can be cast according to any of the coating methods conventionally adopted for casting photoresist resin compositions. For example, spin coating method can be used.

If necessary, the resist pattern coated with the fine pattern-forming composition can be prebaked. The prebaking may be carried out while the temperature is either kept constant or elevated step-by-step. After coated with the fine pattern-forming composition, the resist pattern is heated at, for example, 40 to 200° C., preferably 80 to 160° C., for 10 to 300 seconds, preferably 30 to 120 seconds. This heating procedure is for the purpose of helping the polymer to soak into and/or attach onto the resist.

As a result of casting and heating the fine pattern-forming composition, the resist pattern is so fattened as to increase the width of the ridge lines in the pattern and to decrease the diameter of the hole pattern. Those dimension changes can be properly controlled by selecting the conditions such as the temperature and time of heating, the kind of the photoresist resin composition and the like. Accordingly, the conditions are determined according to how far the resist pattern must be miniaturized, namely, how much the width of the ridge lines in the resist pattern must be broadened and/or how much the diameter of the hole pattern must be reduced. However, each dimension change in the resist pattern normally ranges from 5 to 30 nm in difference between before and after application of the fine pattern-forming composition.

After the resist pattern is essentially miniaturized, the fine pattern-forming composition unreacted with the resist, namely, excess of the composition can be rinsed away with water or solvents, if necessary. The water or solvents for rinsing must have poor ability to dissolve the fine pattern-forming composition soaked into or attached onto the resist pattern but must have high ability to dissolve the extra composition, which is neither soaked into nor attached onto the resist pattern. It is preferred to use a solvent comprised in the fine pattern-forming composition, and it is particularly preferred to use pure water for rinsing.

In the way described above, the resist pattern immediately after developed undergoes dimension change by action of the fine pattern-forming composition, and is thereby essentially miniaturized. The resist pattern thus produced by use of the fine pattern-forming composition according to the present invention is advantageously used in producing semiconductor devices or the like having finer patterns.

The present invention is further explained by use of the following examples.

Example for Forming Resist Pattern 1

An 8-inch silicon wafer was spin-coated with a bottom antireflective coat-forming composition (AZ ArF-1C5D [trademark], manufactured by AZ Electronic Materials (Japan) K.K.) by means of a spin coater (manufactured by Tokyo Electron Ltd.), and then baked at 200° C. for 60 seconds to form an antireflective coat of 37 nm thickness. Subsequently, a photosensitive resin composition (AZ AX2110P [trademark], manufactured by AZ Electronic Materials (Japan) K.K.) was cast thereon and baked at 110° C. for 60 seconds to form a resist layer of 120 nm thickness. The obtained wafer was subjected to first pattern exposure through a mask (line/space=1/1) by means of an ArF-beam (193 nm) exposure apparatus (manufactured by Nikon Corporation). Thereafter, the mask was turned 90 degrees and placed perpendicularly to the direction in the first pattern exposure, and then the wafer was subjected to second pattern exposure. After baked at 110° C. for 60 seconds, the wafer was then subjected to development (negative development) for 30 seconds by use of 2-heptanone, to obtain a resist pattern having a pitch size of 160 nm and a hole size of 80 nm.

Preparation of Fine Pattern-Forming Compositions

The following polymers were employed for preparing fine pattern-forming compositions.

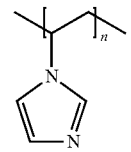
(P1)

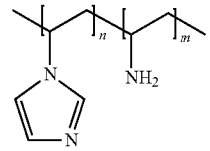
(P2)

n:m = 8:2

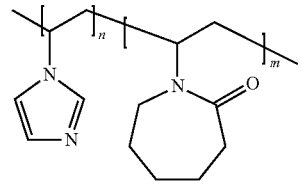
(P3)

n:m = 7:3

-continued

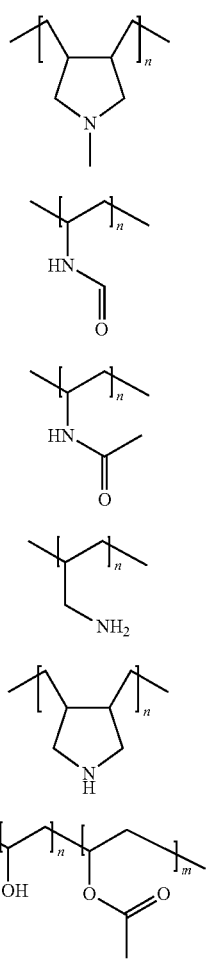

Those polymers were individually dissolved in pure water to prepare fine pattern-forming compositions. According to necessity, acids and/or surfactants were optionally added. Table 1 shows the components and the contents thereof in each composition.

Each prepared composition was cast on the resist pattern 1 by means of a spin coater, then heated at 120° C. for 60 seconds, subsequently washed with pure water, and finally dried. The dimension of the obtained hole pattern was measured to evaluate how much the hole pattern was reduced by the fine pattern-forming composition. In addition, the pattern surface after the development was evaluated by visual observation or by scanning electron microscopy (SEM). The results were shown in Table 1. The surfaces of the obtained fine patterns were classified into the following grades:

A: the resist pattern had such an excellent surface that color unevenness was not found by visual observation and also that roughness was found by SEM not to become worse as compared with the surface before the treatment;

B: the resist pattern had such a good surface that slight color unevenness was found by visual observation but that roughness was found by SEM not to become worse as compared with the surface before the treatment;

C: the resist pattern had such a practically acceptable surface that color unevenness was found by visual observation and that roughness was found by SEM to become slightly worse as compared with the surface before the treatment; and D: the resist pattern had such a practically unusable surface that color unevenness and cloudiness were found by visual observation, that roughness was found by SEM to become remarkably worse as compared with the surface before the treatment, and further that the hole pattern was partly blocked.

TABLE 1

| | Polymer | | | Acid | | Cross-linking agent MEU*4 | Organic solvent PGME*5 | Surfactant | Pure water | pH value of composition | Reduction of hole pattern (nm) | Grade of surface roughness |
|---|---|---|---|---|---|---|---|---|---|---|---|---|
| | compound | weight average M.W. | content (%) | compound | content (%) | content (%) | content (%) | content (%) | content (%) | | | |
| Ex. 1 | P1 | 20,000 | 5.00 | — | — | — | — | 0.05 | 94.95 | 8 | 14 | B |
| Ex. 2 | P1 | 20,000 | 5.00 | nitric acid | 0.25 | — | — | 0.05 | 94.70 | 7 | 12 | A |
| Ex. 3 | P1 | 20,000 | 5.00 | sulfuric acid | 0.25 | — | — | 0.05 | 94.70 | 7 | 12 | A |
| Ex. 4 | P1 | 20,000 | 5.00 | glycine | 0.50 | — | — | 0.05 | 94.45 | 7 | 13 | A |
| Ex. 5 | P1 | 20,000 | 5.00 | acetic acid | 0.50 | — | — | 0.05 | 94.45 | 7 | 13 | A |
| Ex. 6 | P1 | 50,000 | 5.00 | — | — | — | — | 0.05 | 95.00 | 8 | 14 | B |
| Ex. 7 | P1 | 120,000 | 5.00 | — | — | — | — | 0.05 | 95.00 | 8 | 15 | B |
| Ex. 8 | P1 | 50,000 | 5.00 | nitric acid | 0.25 | — | 10 | 0.05 | 84.70 | 7 | 14 | A |
| Ex. 9 | P2 | 40,000 | 5.00 | — | — | — | — | 0.05 | 95.00 | 10 | 14 | C |
| Ex. 10 | P2 | 40,000 | 5.00 | nitric acid | 0.50 | — | — | 0.05 | 94.45 | 7 | 13 | B |
| Ex. 11 | P2 | 40,000 | 5.00 | sulfuric acid | 0.50 | — | — | 0.05 | 94.45 | 7 | 13 | B |
| Ex. 12 | P2 | 40,000 | 5.00 | PTS*1 | 0.50 | — | — | 0.05 | 94.45 | 7 | 13 | B |
| Ex. 13 | P3 | 20,000 | 5.00 | — | — | — | — | 0.05 | 95.00 | 7 | 10 | B |
| Ex. 14 | P3 | 20,000 | 5.00 | citric acid | 0.50 | — | — | 0.05 | 94.45 | 6 | 10 | A |
| Ex. 15 | P4 | 3,000 | 5.00 | — | — | — | — | — | 95.00 | 11 | 11 | C |
| Ex. 16 | P4 | 3,000 | 5.00 | sulfuric acid | 0.50 | — | — | 0.05 | 94.45 | 10 | 10 | B |
| Ex. 17 | P5 | 10,000 | 5.00 | — | — | — | — | 0.05 | 95.00 | 6 | 9 | B |
| Ex. 18 | P5 | 10,000 | 5.00 | sulfuric acid | 0.50 | — | — | 0.05 | 94.45 | 2 | 12 | A |
| Ex. 19 | P6 | 10,000 | 5.00 | sulfuric acid | 0.50 | — | — | 0.05 | 94.45 | 2 | 11 | A |
| Com. 1 | PA | 10,000 | 5.00 | | | — | — | 0.05 | 95.00 | 12 | 10 | D |

TABLE 1-continued

| | Polymer | | | Acid | | Cross-linking agent MEU*4 | Organic solvent PGME*5 | Surfactant | Pure water | pH value of composition | Reduction of hole pattern (nm) | Grade of surface roughness |
|---|---|---|---|---|---|---|---|---|---|---|---|---|
| | compound | weight average M.W. | content (%) | compound | content (%) | content (%) | content (%) | content (%) | content (%) | | | |
| Com. 2 | PA | 10,000 | 5.00 | nitric acid | 0.75 | — | — | | 0.05 | 94.20 | 9 | 10 | D |
| Com. 3 | PB | 3,000 | 5.00 | — | — | — | — | | 0.05 | 95.00 | 12 | N/A*6 | D |
| Com. 4 | PB | 3,000 | 5.00 | nitric acid | 0.50 | — | — | | 0.05 | 94.45 | 10 | N/A*6 | D |
| Com. 5 | PC | 10,000 | 5.00 | — | — | — | — | | 0.05 | 95.00 | 5 | N/A*6 | D |
| Com. 6 | PC | 10,000 | 5.00 | — | — | 0.45 | — | | 0.05 | 94.50 | 5 | N/A*6 | D |

PTS*1: p-toluenesulfonic acid
EL*2: ethyl lactate
PGME*3: propyleneglycol monomethyl ether
MEU*4: (N-methoxymethyl)methoxyetylene urea
PGME*5: propyleneglycol monomethyl ether
N/A*6: not applicable (unmeasurable)

The invention claimed is:

1. A method for forming a miniaturized negative resist pattern, comprising the steps of
   coating a semiconductor substrate with a chemically amplified photoresist composition, to form a photoresist layer;
   exposing to light said semiconductor substrate coated with said photoresist layer;
   developing said photoresist layer with an organic solvent developer after said exposing step, to form a photoresist pattern;
   coating said photoresist pattern with a fine pattern-forming composition comprising: a polymer comprising a repeating unit having a structure of the following formula (A), (B) or (C):

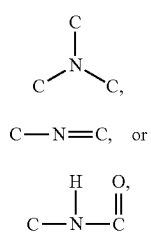

and
an inorganic acid,
a solvent,
where the fine pattern-forming composition has a pH of 2 to 11;
heating the coated photoresist pattern, and
washing to remove excess of the fine pattern-forming composition.

2. The method according to claim 1 for forming a negative resist pattern, wherein said photoresist composition further comprises a photo acid-generating agent.

3. The method for forming a miniaturized negative resist pattern of claim 1 wherein the fine pattern-forming composition has an inorganic acid selected from the group consisting of hydrochloric acid, sulfuric acid, and nitric acid.

4. The method for forming a miniaturized negative resist pattern of claim 1 wherein the fine pattern-forming composition has an inorganic acid, and the inorganic acid is present at 0.5 to 50 wt %, based on the total weight of the polymer.

5. The method for forming a miniaturized negative resist pattern of claim 1 where the fine pattern-forming composition has a pH between 3 and 10.

6. The method for forming a miniaturized negative resist pattern of claim 1 where the fine pattern-forming composition in which the polymer comprises structure (B).

7. The method for forming a miniaturized negative resist pattern of claim 6 where the polymer is selected from the group consisting of P1, P2 and P3

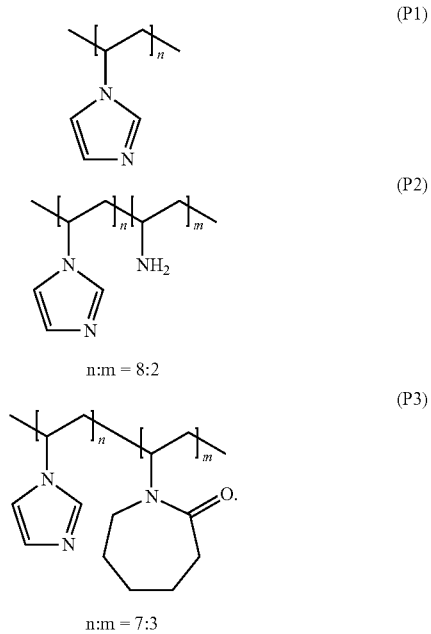

* * * * *